United States Patent
Adel et al.

(10) Patent No.: US 7,566,517 B1
(45) Date of Patent: Jul. 28, 2009

(54) FEATURE PRINTABILITY OPTIMIZATION BY OPTICAL TOOL

(75) Inventors: Michael E. Adel, Zichron Ya'akov (IL); Chris A. Mack, Austin, TX (US)

(73) Assignee: KLA-Tencor Technologies Corp., Milpitas, CA (US)

( * ) Notice: Subject to any disclaimer, the term of this patent is extended or adjusted under 35 U.S.C. 154(b) by 638 days.

(21) Appl. No.: 11/271,207

(22) Filed: Nov. 9, 2005

Related U.S. Application Data

(60) Provisional application No. 60/698,779, filed on Jul. 12, 2005.

(51) Int. Cl.
*G03F 1/00* (2006.01)
(52) U.S. Cl. .............................. 430/5; 430/30; 430/311
(58) Field of Classification Search ..................... 430/5, 430/30
See application file for complete search history.

(56) References Cited

U.S. PATENT DOCUMENTS 6,033,766 A * 3/2000 Block et al. .................. 428/210
2002/0127482 A1 * 9/2002 Maltabes et al. ............... 430/22
2003/0095267 A1 * 5/2003 Mieher et al. ................ 356/614
2003/0170552 A1 * 9/2003 Miyashita et al. .............. 430/30
2004/0190116 A1 * 9/2004 Lezec et al. .................. 359/298
2005/0164095 A1 * 7/2005 Ozawa ........................... 430/5

* cited by examiner

*Primary Examiner*—Mark F Huff
*Assistant Examiner*—Stewart A Fraser
(74) *Attorney, Agent, or Firm*—Weaver Austin Villeneuve & Sampson LLP

(57) ABSTRACT

Methods and apparatus, including computer program products, implementing and using techniques for optimizing feature printability on a semiconductor wafer. A reticle with a quasi-periodic structure is provided. The quasi-periodic structure includes several elements that each contribute to the printed feature to be printed on the wafer. Each element exhibits a slight variation in a reticle feature characteristic compared to an adjacent other element in the quasi-periodic structure. The reticle with the quasi-periodic structure is used to print several printed features on the semiconductor wafer. Each printed feature corresponds to a specific element in the quasi-periodic structure. A metrology process is performed on the semiconductor wafer to generate a signature for each of the printed features. The signature is used to determine an optimum reticle feature characteristic that results in an optimum printed feature.

19 Claims, 9 Drawing Sheets

FEATURE PRINTABILITY OPTIMIZATION BY OPTICAL TOOL

CROSS-REFERENCE TO RELATED APPLICATIONS

The present application claims priority under 35 U.S.C. §119(e) from U.S. Provisional Patent Application No. 60/698,779 entitled "FEATURE PRINTABILITY OPTIMIZATION BY OPTICAL TOOL" filed Jul. 12, 2005, the entire disclosure of which is incorporated herein by reference for all purposes.

BACKGROUND

This invention relates to semiconductor patterning processes for printing features within a semiconductor material. Specifically, it relates to mechanisms for characterizing the transfer of design features into printed features.

A typical semiconductor product is formed from a number of features residing and coupled together within multiple semiconductor layers. Each layer will typically include numerous features belonging to the same or different devices. Each layer of features or pattern is generally formed using some type of semiconductor patterning process, such as photolithography. Each layer pattern is first formed in a photoresist material that is disposed over a particular semiconductor material. Exposure light is then passed through a mask, which forms a design pattern on the resist material, and this design pattern is then exposed onto the resist material forming an exposed pattern on the resist material. Subsequent development of the exposed resist pattern results in activation of such pattern so that the developed resist pattern can be used during an etching process to prevent the semiconductor material underlying the developed resist pattern from being etched away while the semiconductor material that is not underlying the developed resist pattern is etched away, or visa versa. Thus, the semiconductor material underlying the resist pattern areas (or the areas outside the resist pattern) is patterned to form product features.

Patterning processes (e.g., photolithography) are becoming very challenging as the feature sizes go below the standard resolution limit of the patterning tool. One challenge includes achieving an accurate transfer of the design features into final patterned features. Since the wavelength(s) used in the photolithographic process is often longer than the size of the features that are to be printed, this gives rise to various types of diffraction and "smearing" effects when the exposure light is passed through the mask, so that the resulting printed pattern does not look like the design pattern on the mask. Various techniques have been developed to address this problem. One common technique is referred to as Optical Proximity Correction (OPC). OPC applies systematic changes to the mask geometries to compensate for the nonlinear distortions caused by optical diffraction and resist process effects. Specifically, these distortions include line-width variations dependent on pattern density, which affect a device's speed of operation and line-end shortening which can break connections to contacts. Causes include reticle pattern fidelity, optical proximity effects, and diffusion and loading effects during resist and etch processing. A mask incorporating OPC is thus a system that negates undesirable distortion effects during pattern transfer.

There are two basic OPC types, rule-based OPC and model-based OPC. Rule-based OPC sets forth rules describing what results can be generated by various types of mask corrections. For example, one rule may dictate that nonprintable square features are to be added to each corner of a square shaped mask feature having a certain size specification so as to minimize corner rounding on the printed square feature. These rules were typically based on experience. Model-based OPC, which currently is the most common OPC type, is accomplished by performing optical modeling for a particular system and then doing an inverse analysis of the model to determine the optimal OPC for a particular feature on the mask.

Generating OPC models is a significant burden for semiconductor product manufacturers. Typically, an OPC model is used to determine an OPC feature for a given mask feature type and lithography process, and this OPC result must then be used to print an actual test wafer to determine whether the models resulted in the desired feature shape. The printed features are measured, and such measurements are then fed back into the model to then tune the model to achieve even better results for a given set of conditions. For instance, the model is tuned for the specific photolitohographic process of the semiconductor product fabrication, including the specific reticle write tool used, the mask used, the numerical aperture used, the sigma used, the illumination mode used, and so on. In a second tuning stage, the models need to be tuned to the actual specific devices. Often, this two stage tuning process requires many thousands of iterative measurements to be performed to achieve an optimum OPC for a given device feature and set of process conditions.

Typically, the measurements are carried out using a scanning electron microscopy (SEM) system. These measurements are commonly referred to as CD-SEM (Critical Dimension Scanning Electron Microscope) measurements. CD-SEM systems have special software for measuring the size of critical dimensions. However, SEM systems require a significant amount of time—often several hours—to load and seal the wafer into the vacuum and then to acquire the high resolution image using the SEM. Also, the CD-SEM measurements do not provide any clear indication of the exact degree of modification or tuning that is necessary for the OPC model. Thus, it is difficult to efficiently determine whether particular feature characteristics, such as shape or location fidelity, are within specification or are likely to fail using conventional inspection techniques. Furthermore, the SEM systems use electron beams, which may modify the structural characteristics of the feature under test, due to the ionizing effects of the electron beams. SEM systems are also typically relatively slow, which is a significant drawback, since typically several thousands of measurements are required for OPC model optimization. The current SEM measurement methods also require multiple discrete measurements for each "point" in the OPC multi-parameter space.

SUMMARY

In general, in one aspect, the invention provides methods and apparatus, implementing and using techniques for optimizing feature printability on a semiconductor wafer. A reticle with a quasi-periodic structure is provided. The quasi-periodic structure includes several elements that each contribute to the printed feature to be printed on the wafer. Each element exhibits a slight variation in a reticle feature characteristic compared to an adjacent other element in the quasi-periodic structure. The reticle with the quasi-periodic structure is used to print several printed features on the semiconductor wafer. Each printed feature corresponds to a specific element in the quasi-periodic structure. A metrology process is performed on the semiconductor wafer to generate a signature for each of the printed features. The signature is used to determine an optimum reticle feature characteristic that results in an optimum printed feature.

Advantageous implementations can include one or more of the following features. Using the signature to determine an optimum reticle feature characteristic that results in an optimum printed feature can include comparing one or more of the measured signatures with a known signature corresponding to an optimum printed structure and either identifying a best match between one or more of the measured signatures and the known signature and defining the reticle characteristic of the matched measured signature as the optimum reticle feature characteristic, or interpolating or extrapolating the optimum element characteristic based on the comparison between the one or more measured signatures and the known signature. The known signature can be generated by simulating the metrology process on the optimum printed structure. The elements in the quasi-periodic structure can exhibit a continuous variation from a first shape on a first end of the quasi-periodic structure to a second shape on a second end of the quasi-periodic structure. The quasi-periodic structure can include about 50-200 elements.

Using the signature to determine an optimum reticle feature characteristic that results in an optimum printed feature can include matching each of the measured signatures with one of several known signatures corresponding to printed features with known appearances, providing the measured optical signatures to an optical proximity correction modeling system and using the measured optical signatures in the optical proximity correction modeling system to optimize an optical proximity correction model used in printing the feature on the semiconductor wafer. The known signatures can be generated by simulating the metrology process on a plurality of known printed features. The measured optical signatures can be used to optimize one or more process parameters in a system that is used to print the feature on the semiconductor wafer, in order to achieve improved feature printability. The process parameters can be selected from a group consisting of: focus parameters and dose parameters. The measured optical signatures can be used to optimize one or more etch process parameters in a system that is used to etch the printed feature on the semiconductor wafer, in order to achieve improved feature printability. The measured optical signatures can be used to optimize one or more yield prediction parameters in a system that is used to predict yield of semiconductor wafers.

Performing metrology on the semiconductor wafer can include performing optics metrology using a scatterometry measurement technique. The scatterometry technique can be selected from a group consisting of: spectroscopic scatterometry techniques and angular scatterometry techniques. The scatterometric signals can be recorded with a two-dimensional detector having a first axis for registering spectral or angular scatterometry data, and a second axis for registering spatial data corresponding to the positions of the elements in the quasi-periodic structure. Performing metrology on the semiconductor wafer can include generating a metrology recipe based on the quasi-periodic structure on the reticle and performing the metrology of the semiconductor wafer in accordance with the generated metrology recipe.

In general, in one aspect, the invention provides a reticle for use in optimizing feature printability in a semiconductor wafer printing process. The reticle includes a quasi-periodic structure having several elements that each contributes to the feature to be printed. Each element exhibits a slight variation in appearance compared to the other elements in the quasi-periodic structure.

Advantageous implementations can include one or more of the following features. Each element can have a slightly varying position of a Sub Resolution Assist Feature with respect to a line structure as compared to an adjacent element. Each element can have a slightly varying characteristic of an optical proximity correction feature with respect to an adjacent printable structure as compared to an adjacent element.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1A:
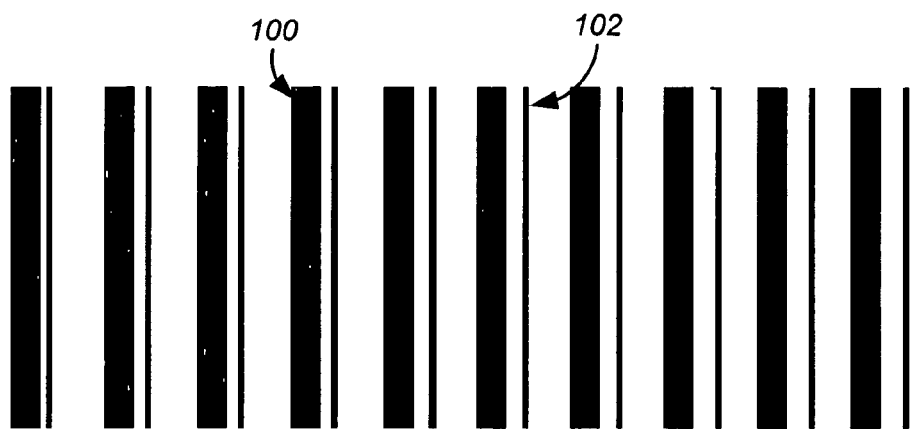
FIGS. 1A-1C show various examples of quasi periodic structures in accordance with one embodiment of the invention.

Reference will now be made in detail to a specific implementation of the invention. An example of this implementation is illustrated in the accompanying drawings. While the invention will be described in conjunction with this specific implementation, it will be understood that it is not intended to limit the invention to one implementation. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

In general, embodiments of the present invention provide mechanisms for characterizing the printability of any suitable continuously varying mask feature. For example, mask structures are designed to have a parameter that continuously varies across the mask structures. By way of a specific example, in order to identify the correct OPC geometry, embodiments of the invention provide method and apparatus for obtaining metrology data over a continuous design space for a given feature parameter. A continuum of solutions can be rapidly sampled in search of the optimal OPC solution. This enables the determination of either the exact value of the feature parameter to be verified by experiment or the parametric dependence between the specific geometry on the decorated *.gds and the desired geometry. Several embodiments for characterizing the printability of OPC features will now be described. However, it should be recognized that the techniques of the present invention may be applied to any suitable mask feature, besides OPC mask features.

In one embodiment, determination of an optimum OPC parameter value is accomplished by designing and printing on a reticle specialized proxies which contain a quasi-periodic structure. The quasi-periodic structure is designed with a constant pitch, but with a specific characteristic of the feature varying continuously from one end of the proxy to the other. The proxies are then measured by scatterometric techniques, such as spectroscopic or angular scatterometric techniques. In one embodiment, a two dimensional detector array is provided, which has a first axis that is committed to a spectral or angular data domain and a second axis that is committed to a spatial domain. This results in a spatially continuous signal being acquired along the slowly varying direction of the proxy structure. This signal can be compared to a corresponding signal generated based on a "designers intent" in order to find a best match for an OPC optimization for the specific feature under test. The invention will be described in further detail below by way of example, but first a brief overview of scatterometry will be presented.

Scatterometry is a collection of known techniques for performing critical dimension metrology on features that are printed using photolithography. In contrast to imaging-based techniques, scatterometry measurements are based on examining how various features on the printed wafer scatters light. There are currently two main categories of scatterometry: spectroscopic scatterometry and angular scatterometry. In spectroscopic scatterometry, printed features on semiconductor wafers are characterized based on how incident light is scattered as a function of the wavelength of the incident light. In angular scatterometry, printed features on semiconductor wafers are characterized by studying angular distributions of scattered light, either as a function of the angles of the incident light, or by measuring angles of the scattered light. Many combinations of these techniques are available. One example of such a combination technique is referred to as spectroscopic ellipsometry. In this technique, the incident light is a plane wave illuminating some printed feature on the wafer, and the scattering of the light is studied either as a function of the wavelength of the incident light, or as a function of angles of the incident light or the scattered light, as described above. The polarization state of the incident light can also be changed and the polarization state of the scattered light can be studied.

Common for all these techniques is that they do not generate any image of the scattering feature, but rather a "scattering signature" in the form of a scattered signal which can be used to characterize the features that are scattering the light. The characterization can be accomplished with reference to a "library" including a number of signatures and known objects to which the signatures correspond. That is, the library contains a number of features and their corresponding scatterometry signals as a function of angle or wavelength. If no direct match can be found in the library, various correlations or extrapolation techniques can be used to determine a closest match of the detected scattering signal to the recorded scatterometric signal.

The library may be generated in any suitable manner. In one implementation, a number of features are provided. A metrology model is then used to simulate the specific metrology tool that can be used to measure such provided features. The metrology model generates a scatterometry signal for each provided feature, and the results for each feature are stored in the library for comparison to actual metrology results.

Figure 1B:
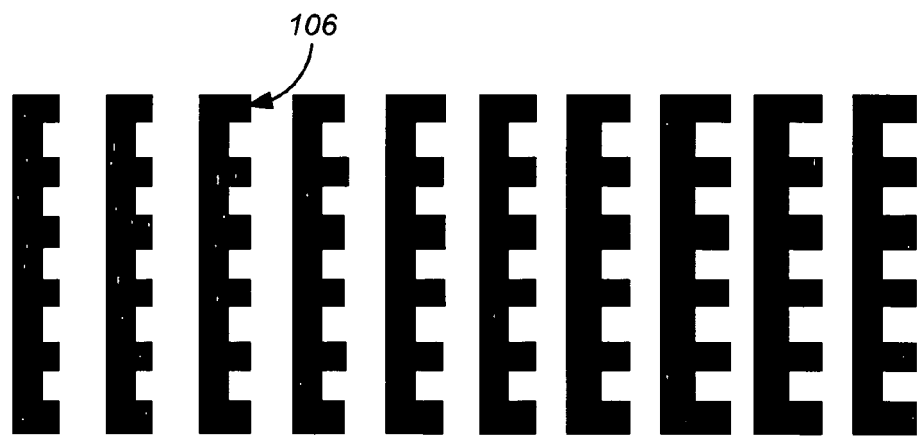
Figure 1C:
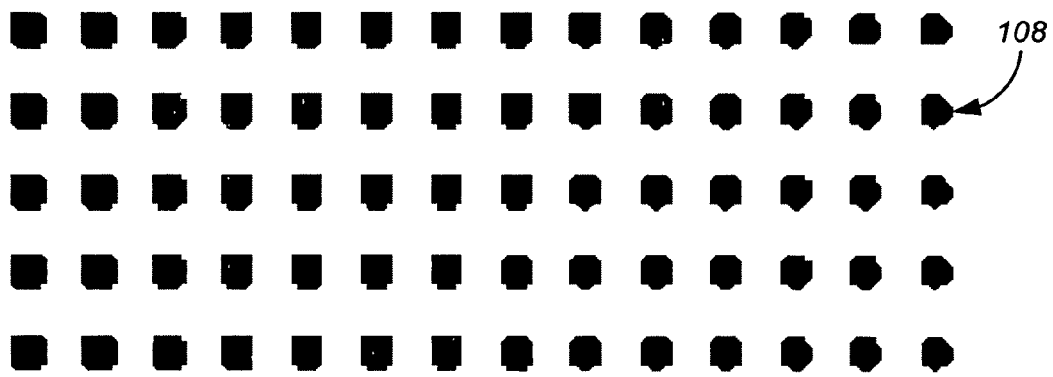

As was described above, a quasi-periodic structure is used, in which a particular OPC feature is varied across the quasi-periodic structure, typically from a minimum value to a maximum value. Of course, any suitable mask feature may also be used to form a quasi-periodic structure. Some examples of quasi-periodic OPC type structures are shown in FIGS. 1A-1C. In particular, FIG. 1A shows a Sub-Resolution Assist Feature (SRAF). The thick lines (100) represent design features that have a "semi-isolated" pitch. The notion of "semi-isolated" pitch can be explained in the following way. An isolated line is one which is sufficiently far away from neighboring features, for there to be no optical proximity effect from neighboring features during the lithographic imaging process. In contrast, a dense feature usually refers to a case where the optical proximity effects are strong and where the way in which the feature prints is fundamentally dependent on the periodic nature of the dense feature. A semi-isolated feature is somewhere in the gray area between dense features and isolated features, that is, where the optical proximity effects are weak but cannot be neglected. The thin lines (102) are SRAFs, which are included on the reticle, but are generally too small to be printed on the wafer. That is, the SRAFs are significantly below the resolution that can be printed. By putting the SRAFs on the reticle, the adjacent features, that is, the thick lines (100), will print differently on the wafer. It should be noted that the structures used herein are not limited to semi-isolated pitch. For example, the thick lines (100) can be completely isolated in some embodiments.

As can be seen in FIG. 1A, the distance between the SRAF line (102) and the design feature (100) is gradually increased from left to right in the figure. This gradual variation of a particular feature characteristic is also referred herein as a "continuously varying" characteristic. This variation causes the design feature (100) to print with different appearances across the quasi-periodic structure. For example, the location of the SRAF relative to a reticle feature can affect the printed line's width or position or symmetry. Even though the quasi-periodic structure typically shows a uniform rate of change on the reticle, the resulting printed features can exhibit a threshold-like or non-linear behavior. Thus, if only a few examples were measured separately, which is often the situation in prior art methods, it would often be impossible to know if such a threshold exists and where that threshold is located in terms of SRAF placement or impossible to characterize the feature's non-linear behavior as a function of SRAF location. A continuously varying SRAF placement, as provided by the quasi-periodic structure in accordance with the invention, combined with a way to sample the whole range of SRAF placements along the quasi-periodic structure, makes it possible to determine an SRAF placement that causes a threshold to occur in the range of printed features or facilitates one to determine a dependency function that relates the SRAF location and resulting printed characteristic (e.g., line width).

The quasi-periodic structure may contain any number of varying features and may depend on various conditions, such as the range of feasible feature variations that the designer had in mind, the lithographic tool's pitch limit, to achieve a local constant pitch, etc. as described further below. In a quasi-periodic structure for SRAF placement example, about 50-200 repetitions of the design feature (100) with varying SRAF line (102) placements works well. As will be described below, the apparatus and methods for determining how the printed feature varies from the left hand side of the quasi-periodic structure to the right hand side of the quasi-periodic structure can be varied in many different ways. However, the variation preferably slowly varies across the structures such that the local structure appears to be substantially constant. The central idea is to have a specific feature that varies substantially, continuously across the quasi-periodic structure.

As the skilled reader realizes, this variation can be embodied in a number of ways. In one embodiment of the SRAF placement example, there may be a smooth and continuous variation of the distances between the SRAF lines (102) and their corresponding design features (100). For example, going from left to right in the quasi-periodic structure, the distances between the SRAF lines (102) and their corresponding design features (100) for the respective design features may vary smoothly and continuously as 0.22, 0.23, 0.24, 0.25, . . . , 0.37, 0.38, 0.39, 0.40 in some predetermined unit. In another embodiment of the SRAF placement example, there may be a gradual but stepwise variation of the distances between the SRAF lines (102) and their corresponding design features (100). For example, going from left to right in the quasi-periodic structure, the distances between the SRAF lines (102) and their corresponding design features (100) for the respective design features may vary as 0.22, 0.22, 0.22, 0.23, 0.23, 0.23, 0.24, 0.24, 0.24, 0.24, . . . , 0.37, 0.37, 0.37, 0.38, 0.38, 0.38, 0.39, 0.39, 0.39, 0.39, 0.40, 0.40, 0.40 in some predetermined unit.

FIG. 1B shows another example of a quasi-periodic structure that includes a line shortening feature in accordance with one embodiment of the present invention. Typically, in a photolithographic process, a line will print shorter on a wafer than it is on the reticle. This is referred to as line-end shortening. It is difficult to know what line end length on the reticle will result in a printed line of desired dimensions on the wafer. This problem can be overcome with a quasi-periodic structure in accordance with the invention. As can be seen in FIG. 1B, in this case the quasi-periodic structure that is printed on the reticle contains a continuum of line end lengths (106) that vary from being short in the left hand side of FIG. 1B, to being long in the right hand side of FIG. 1B.

Yet another example is shown in FIG. 1C, which shows a quasi-periodic structure (108) for determining contact hole rounding. As the skilled reader realizes, in principle, there is no limit to the complexity of the quasi-periodic structure or the types of features that can be included and varied in the quasi-periodic structure. Thus the quasi-periodic structures shown in FIGS. 1A-1C are only to be seen as representative examples illustrating the principles of the invention, rather than examples limiting the applicability of the invention. In one embodiment, the outer ranges of the quasi-periodic structure are defined by a range of reasonable feature set that the designer has in mind, based on previous experience. Typically, a designer has a "rule of thumb" that tells her what the reasonable range is of the quasi-periodic structure.

Figure 2:
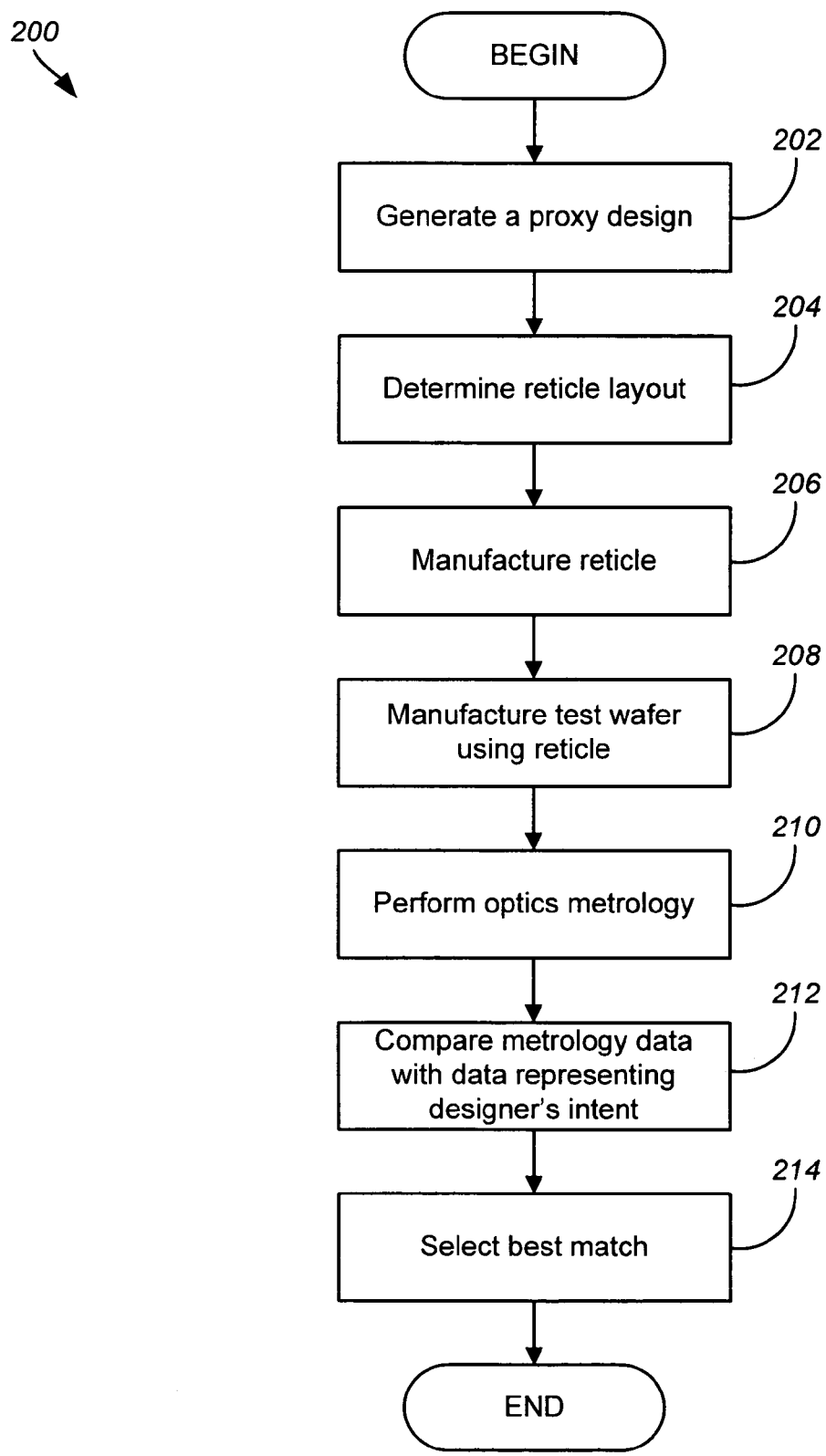
FIG. 2 shows a flowchart of a process for performing measurements in accordance with one embodiment of the invention.

FIG. 2 shows a flowchart of a process for performing measurements in accordance with one embodiment of the invention. As can be seen in FIG. 2, the process starts by generating a proxy design (step 202). The proxy contains the quasi-periodic structure, which has a continuously varying feature, such as an SRAF as was discussed above with respect to FIG. 1A, going from a minimum value to a maximum value. As can be inferred from the name, the proxy functions as a "stand-in" for the device feature itself, on which the OPC otherwise would be run. The proxy can also be referred to as a metrology target.

The design is generally converted into a suitable format that allows a pattern corresponding to the design to be produced onto a reticle. For instance, design data may be in a GDSII format. Design data may be composed of one or more electronic representations of layout patterns for IC layers that are converted into a plurality of reticles that are then used to fabricate a plurality of physical layers of an IC device or structure. Each physical layer of the fabricated IC device corresponds to one of the reticles and an associated one of the electronic representations of the circuit pattern database. For example, one electronic representation may correspond to a diffusion pattern on a silicon substrate, another to a gate oxide pattern, another to a gate polysilicon pattern, another to a contact pattern on an interlayer dielectric, another to a line pattern on a metallization layer, and so on. Each electronic representation is composed of a plurality of polygons or other shapes, which together define the reticle pattern. In the illustrated example, the proxy is composed of one layer and, accordingly, one reticle is used to fabricate the corresponding printed feature. However, the proxy structures may be formed from any number and type of layers. Typically however, the proxies are formed and measured only in a photoresist layer. In some instances the process may proceed through etch and other process steps prior to metrology.

Next, the reticle layout is determined (step 204) by taking features and laying them out on the reticle. Typically, multiple proxies are built (one for each feature) and combined on the reticle. In one embodiment, as part of the reticle layout, design data for the various proxies and their locations are also passed on to an automatic metrology recipe generation process, which generates a metrology recipe that is used when measurements are performed, as will be described in further detail below in the context of step 210 of the process. As is well known by those skilled in the art, in order to generate a metrology recipe, it is preferable to know the locations of the features on the proxy, such that they can be adequately measured on the corresponding wafer. Alternatively, various image searching techniques may be employed to locate the printed features.

After the reticle layout has been determined, the reticle is manufactured using conventional reticle manufacturing methods (step 206). The reticle may be written using any suitable pattern generator or reticle writer equipment, such as a vector scan E-beam tool model EBM-4500, which is commercially available from Nuflare Technology Inc., Japan. A test wafer is then printed using the reticle (step 208). The printed pattern, resulting from the quasi-periodic structure, on the test wafer is then measured using one of the optical techniques discussed above (step 210). Some exemplary optical setups for performing these kinds of measurements have been disclosed in copending U.S. patent application Ser. No. 10/729,838, entitled "APPARATUS AND METHODS FOR DETECTING OVERLAY ERRORS USING SCATTEROMETRY," filed on Dec. 5, 2003, which is hereby incorporated by reference for all purposes. Some details of these optical setups will be discussed in further detail below with respect to FIG. 3.

In the process shown in FIG. 2, the results of the measurements in step 210 may be, for example, an array of SE (Spectroscopic Ellipsometry) data sets. The size of the array depends on the number of different graphs or sets of data that are obtained as a function of the position along the quasi-periodic structure. As the skilled reader will appreciate, the SE data sets are merely examples of one technique that can be used. Other types of scatterometric data sets can also be used. The resulting data does not have to be in the form of an array of signatures, but can alternatively be broken up into several individual signatures that later can be strung together, if so desired. In other embodiments of the invention, the metrology can be performed with non-optical tools. For example, the quasi-periodic structure can be imaged on a CD-SEM, and measurements (e.g., feature dimensions) can be performed on the image itself as a function of image position.

After the metrology has been performed on the test wafer, the results are compared with data of the same format (e.g., from a library), in this case an SE signal, representing a simulated measurement of the designer's intent (step 212). In the imaging embodiment, the measurement data may be directly compared to a corresponding measurement in an image based on the designer's intent. The designer's intent is the structure that the designer intended to create on the wafer. In the optical metrology embodiments, there are several conventional ways in which such simulated optical measurements can be performed. For example, one type of spectroscopic ellipsometry simulations is a Rigorous Coupled Wave Approximation (RCWA) simulation, which is a standard method today used by people of ordinary skill in the art. The result of this simulation is an ideal data set, representing the metrology signal from what is expected to be printed on the wafer by one of the quasi-periodic structure elements. Finally, a best match is selected (step 214), which represents the OPC (or any other suitable optimum mask feature characteristic) that needs to be applied in order to print the desired structure on the wafer, and the process ends. The selected OPC match can be an exact match with the designer's intent or, if no exact match exists, an interpolated or extrapolated match among the elements in the quasi-periodic structure. The selected OPC and its relationship to the resulting designer intent structure may be fed back the models for determining OPC so as to improve the models' accuracy.

In a different embodiment of the invention, the mapping and selection of a best match in steps 212 and 214 are not carried out, but instead all the results of the measurements in step 210 are saved. Each of the measurements can then be mapped to a particular feature in an OPC library, such that different locations across the quasi-periodic structure are mapped to a particular printed feature. Thus, a relationship between the printed feature and its corresponding reticle characteristic may be determined, and this relationship information can then be used in OPC modeling to further enhance the OPC models.

Several embodiments of optical systems for measuring the printed features resulting from the quasi-periodic structure have been disclosed in the above referenced copending patent application. In particular embodiments, a two dimensional detector, such as a CCD (Charge Coupled Device) detector, is employed on which spatial information can be registered in one dimension of the CCD and spectral information can be registered in the other dimension of the CCD. As the skilled reader realizes, depending on the measuring method used, the information collected by the CCD could alternatively be spatial information in one dimension and angular information in the other dimension. In one embodiment, the quasi-periodic structure is oriented so that the spatial axis of the CCD aligns with the direction of the variation of the quasi-periodic structure. This allows a dense collection of spectra to be collected as a function of the position along the quasi-periodic structure. A complete description of various embodiments of the optical measurement system can be found in above referenced patent application. An overview, highlighting some important features of the optical system for the present invention, is presented below.

Scatterometry System Embodiments and Use

Several of the techniques of the present invention can be implemented using any suitable combination of software and/or hardware system. At a minimum, the system will usually include (i) a source of illumination oriented to direct radiation onto a specified location of the sample target; and (ii) one or more detectors oriented to detect a scatterometry signal which has been scattered by the sample target.

Regardless of the system's configuration, the system can employ one or more memories or memory modules configured to store data, program instructions for the general-purpose inspection operations and/or the inventive techniques described herein. The program instructions can control the operation of an operating system and/or one or more applications. The memory or memories can also be configured to store scatterometry data obtained from the sample targets and error results and optionally other measurement data.

Because such information and program instructions can be employed to implement the systems/methods described herein, embodiments of the present invention relates to machine readable media that include program instructions, state information, and so on for performing various operations described herein. Examples of machine-readable media include, but are not limited to, magnetic media such as hard disks, floppy disks, and magnetic tape; optical media such as CD-ROM disks; magneto-optical media such as floptical disks; and hardware devices that are specially configured to store and perform program instructions, such as read-only memory devices (ROM) and random access memory (RAM). The invention can also be embodied in a carrier wave traveling over an appropriate medium such as airwaves, optical lines, electric lines, and so on. Examples of program instructions include both machine code, such as produced by a compiler, and files containing higher level code that can be executed by the computer using an interpreter. Several of the system embodiments described below are mainly described and illustrated with respect to a scatterometry system for obtaining spectra from sample targets resulting from the quasi-periodic structure, while the processor and memory are not shown.

Figure 3:
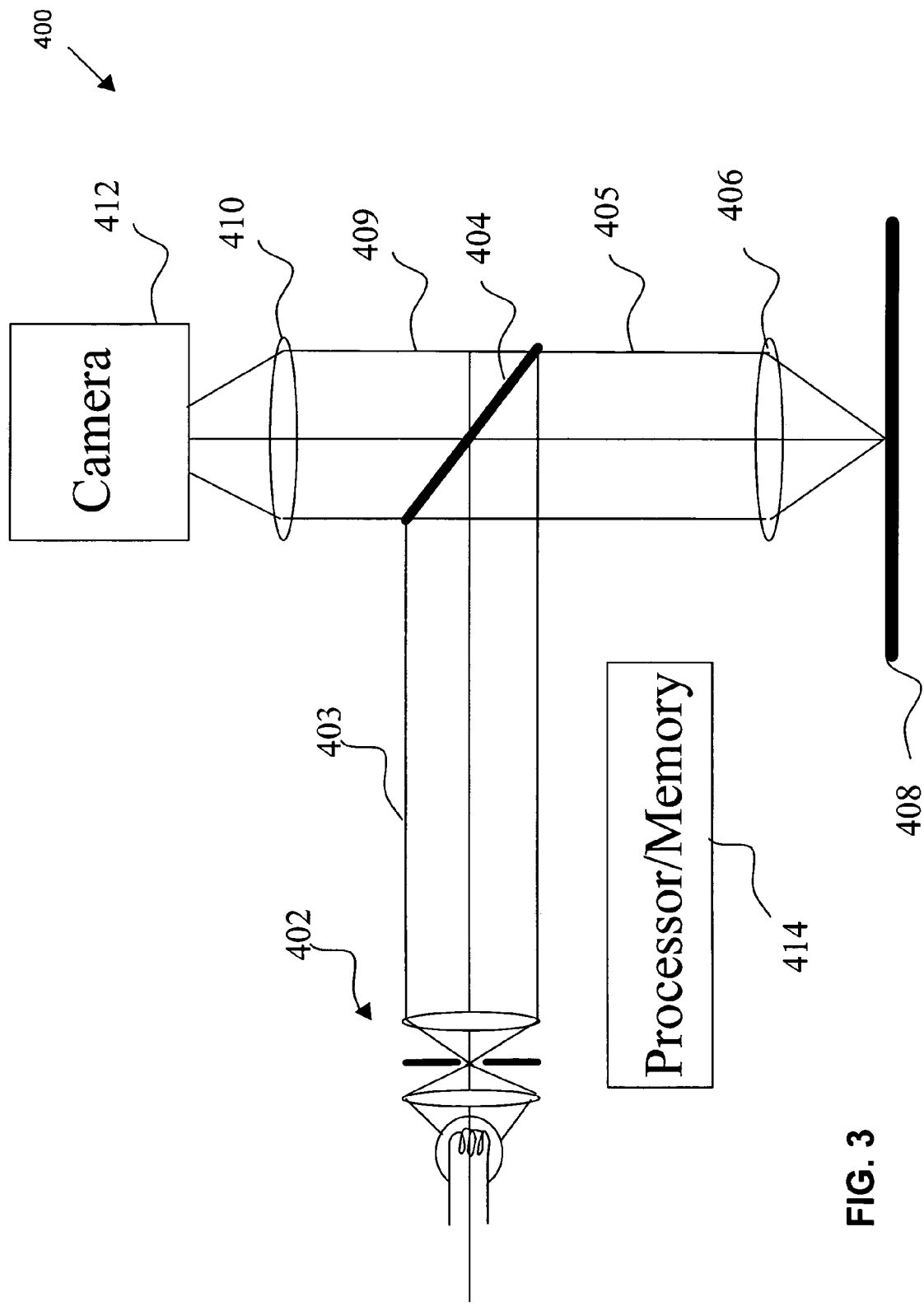
FIG. 3 shows a schematic view of an optical architecture for performing measurements in accordance with one embodiment of the invention.

Imaging Metrology Systems in Which the Numerical Aperture is Optimized for Measurement of Scattering Structures FIG. 3 is a diagrammatic representation of a microscopic imaging system. As shown, the imaging system 400 includes a beam generator 402 for producing an incident beam 403 of electromagnetic radiation, a beam splitter 404 for directing the incident beam 405 towards the sample target 408. Typically, the incident beam is focused onto the sample target by an objective lens 406. An output beam 409 is then emitted from the sample target in response to the incident beam and passed through the beam splitter 404 through relay lens 410 onto imager or camera 412. The camera 412 generates an image of the sample target based on the output beam 409. The system 400 also includes a processor and one or more memory 414 which are configured to control the various components, such as the beam generator 402, objective lens 406, and cameral 412. The processor and memory are also configured to analyze the detected output beam or image implementing the various scatterometry techniques described above.

In one embodiment of the present invention, the illumination and imaging numerical apertures (NAs) of an imaging optical system are chosen to optimize the performance of the instrument on scattering structures by ensuring that only the zero'th diffraction order is collected. One can take advantage of the fact that there exist performance advantages for certain metrology or inspection tasks pertaining to the quasi-periodic structures when only the zero order diffraction is collected by the detection system. Under this condition, only the specular reflection is collected. Since the output that is scattered out of the specular is not collected and the nonspecular output can be more sensitive to aberrations, collection of only the specular output tends to minimize effects caused by optics aberrations. This condition also will result in a tool, which will be optimized for relative photometric measurements of multiple sites in the field of view as described further below. Very low "tool induced shift" (TIS) can also be achieved, as compared to conventional imaging systems. Much higher throughput can also be achieved than with conventional scatterometry systems.

Figure 4A:
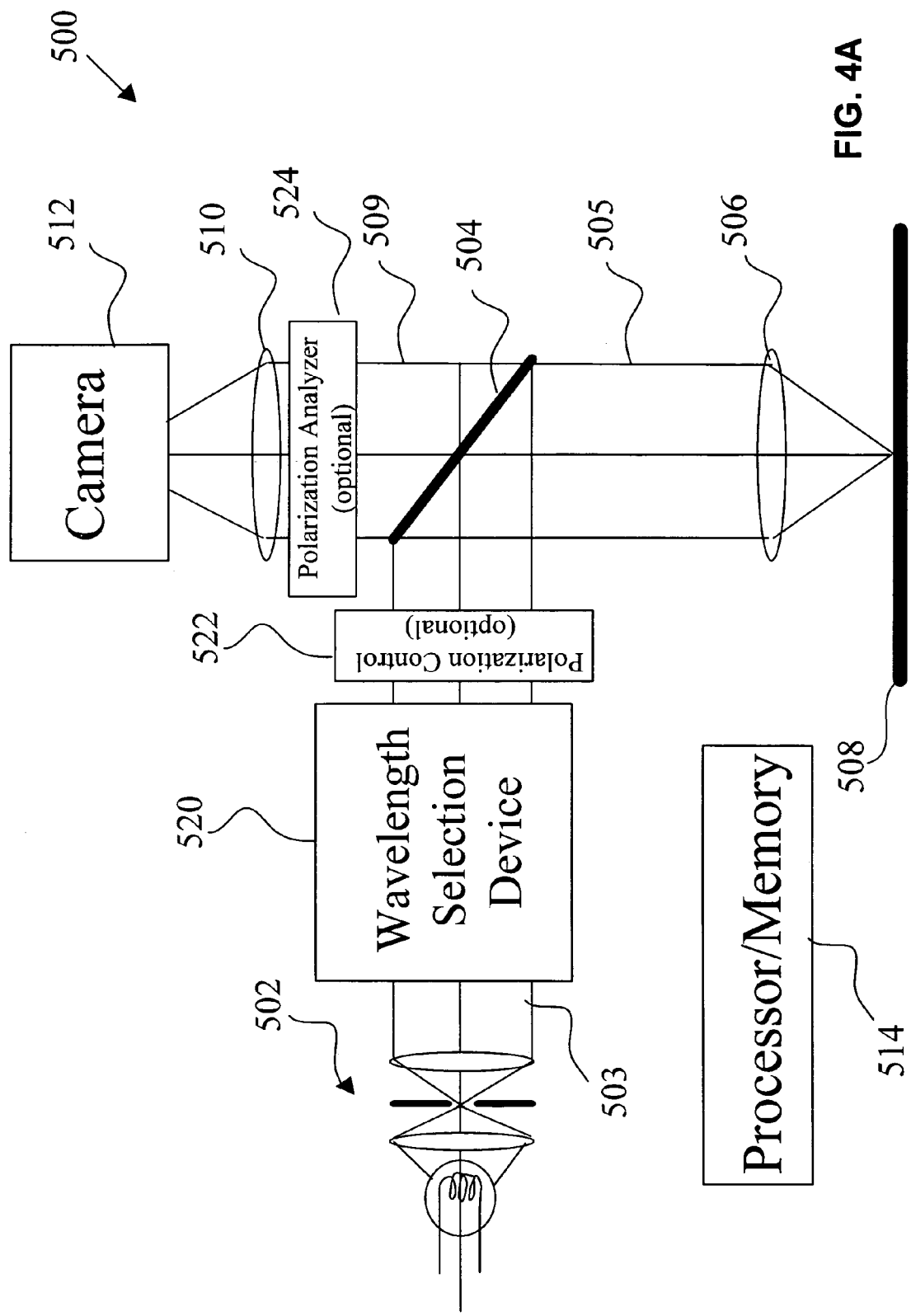
FIG. 4A shows a diagrammatic representation of a microscopic imaging system having a numerical aperture (NA) optimized for scattering characteristics in accordance with a first embodiment of the present invention.

FIGS. 4A through 4D illustrate four embodiments of microscopic imaging systems having a numerical aperture (NA) optimized for scattering characteristics. As shown in FIG. 4A, the system 500 can have components which operate like the same named components of the system in FIG. 3. The system 500 further includes a wavelength selection device 520 for selecting a particular wavelength. The wavelength selection device 520 allows modification of the spectral band by selectively transmitting or selectively reflecting part or portions of the illuminating radiation. A wide variety of well known spectroscopic filtering techniques can be employed to modify the spectra band, including selecting from a set of band pass interference filters, continuously varying bandpass interference filters, grating based spectrometers, Fourier transform interferometers, acousto-optic tunable filters, to name a few. The wavelength selection device 520 is positioned within the incident beam path between the beam. The system 500 can also include a polarizer control device 522 for causing the incident beam to be in a particular polarization state and a polarization analyzer 524 for analyzing or separating out the polar components of the collected beam.

Figure 4B:
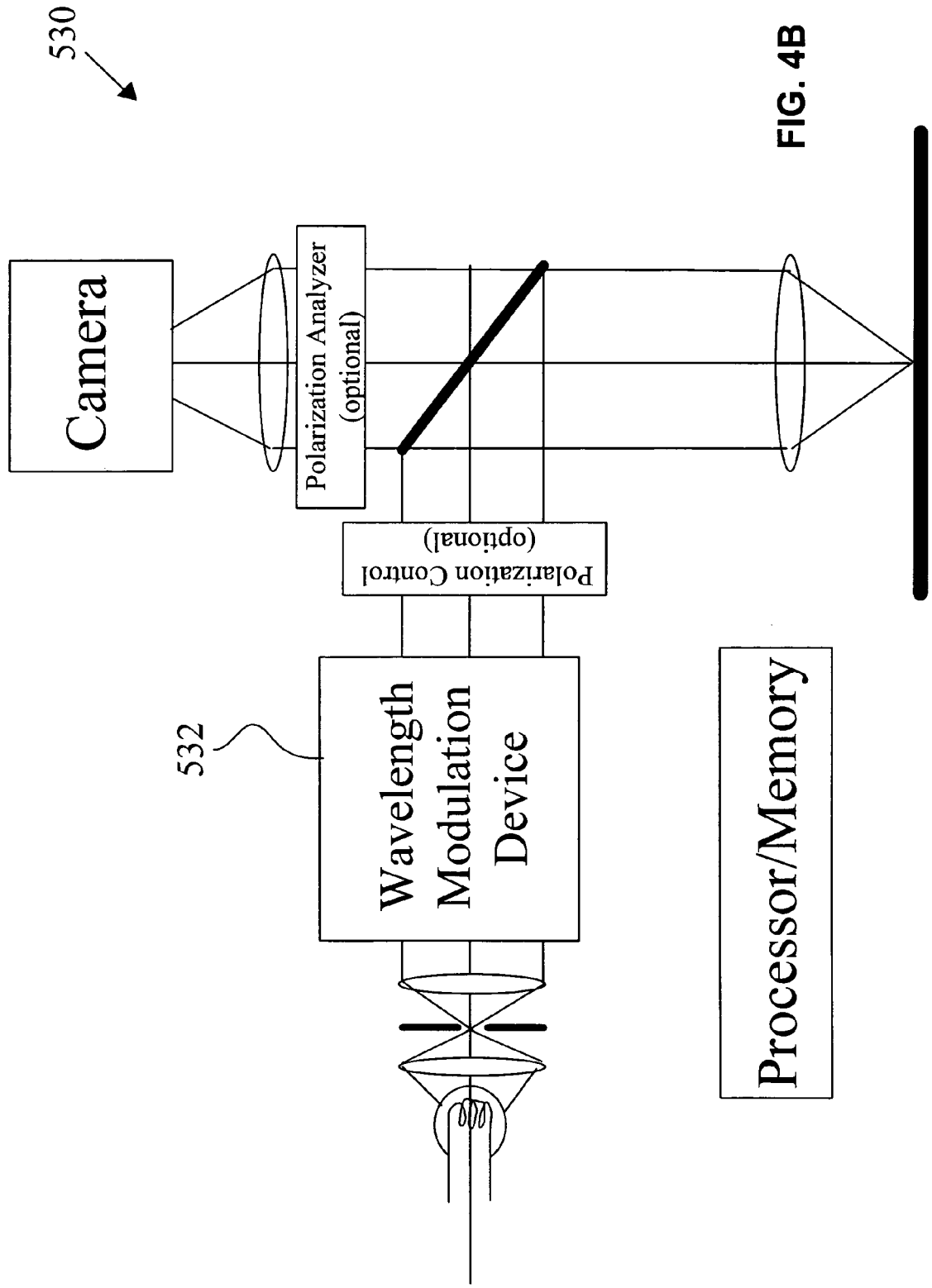
FIG. 4B shows a diagrammatic representation of a microscopic imaging system having a numerical aperture (NA) optimized for scattering characteristics in accordance with a second embodiment of the present invention.
Figure 4C:
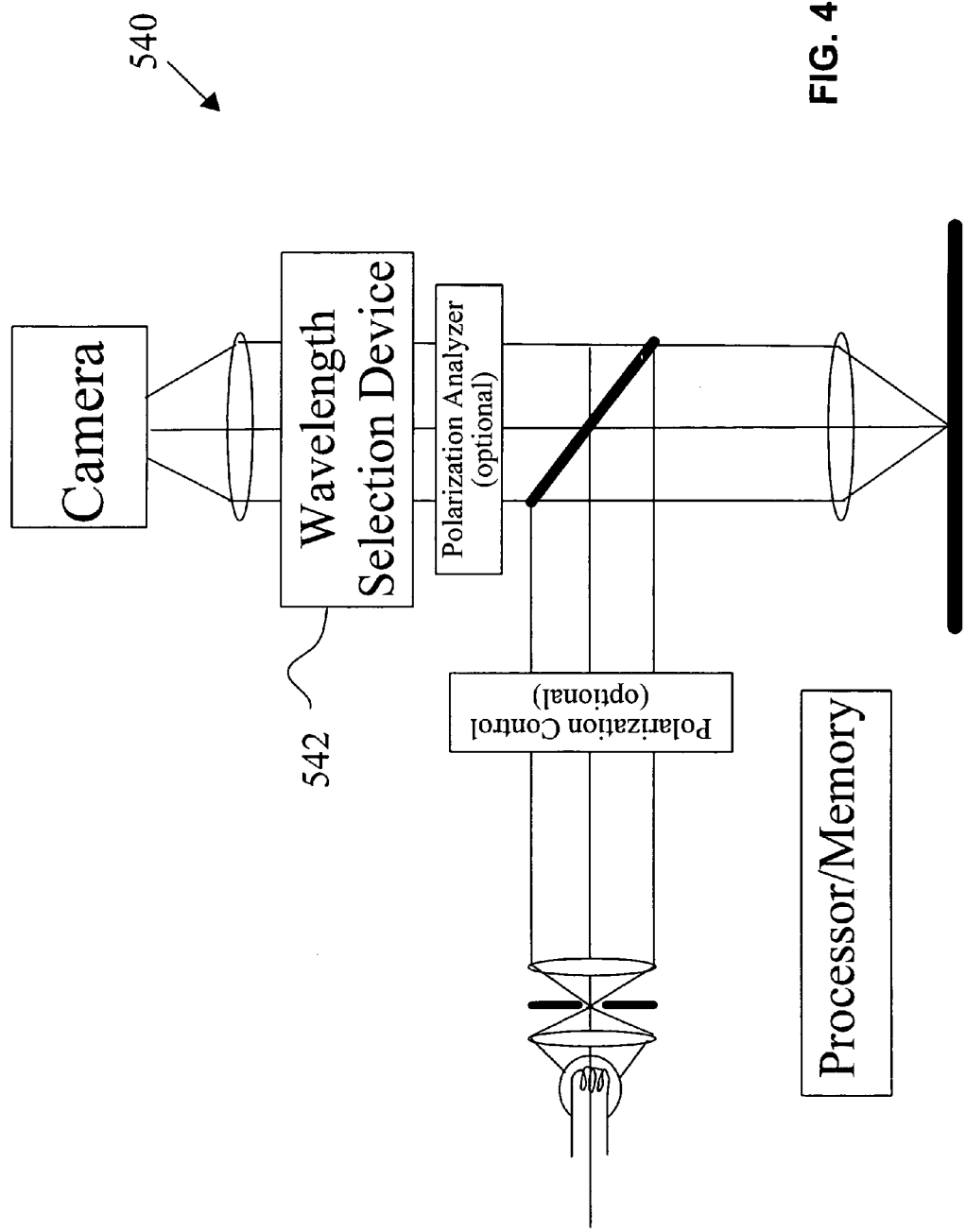
FIG. 4C shows a diagrammatic representation of a microscopic imaging system having a numerical aperture (NA) optimized for scattering characteristics in accordance with a third embodiment of the present invention.
Figure 4D:
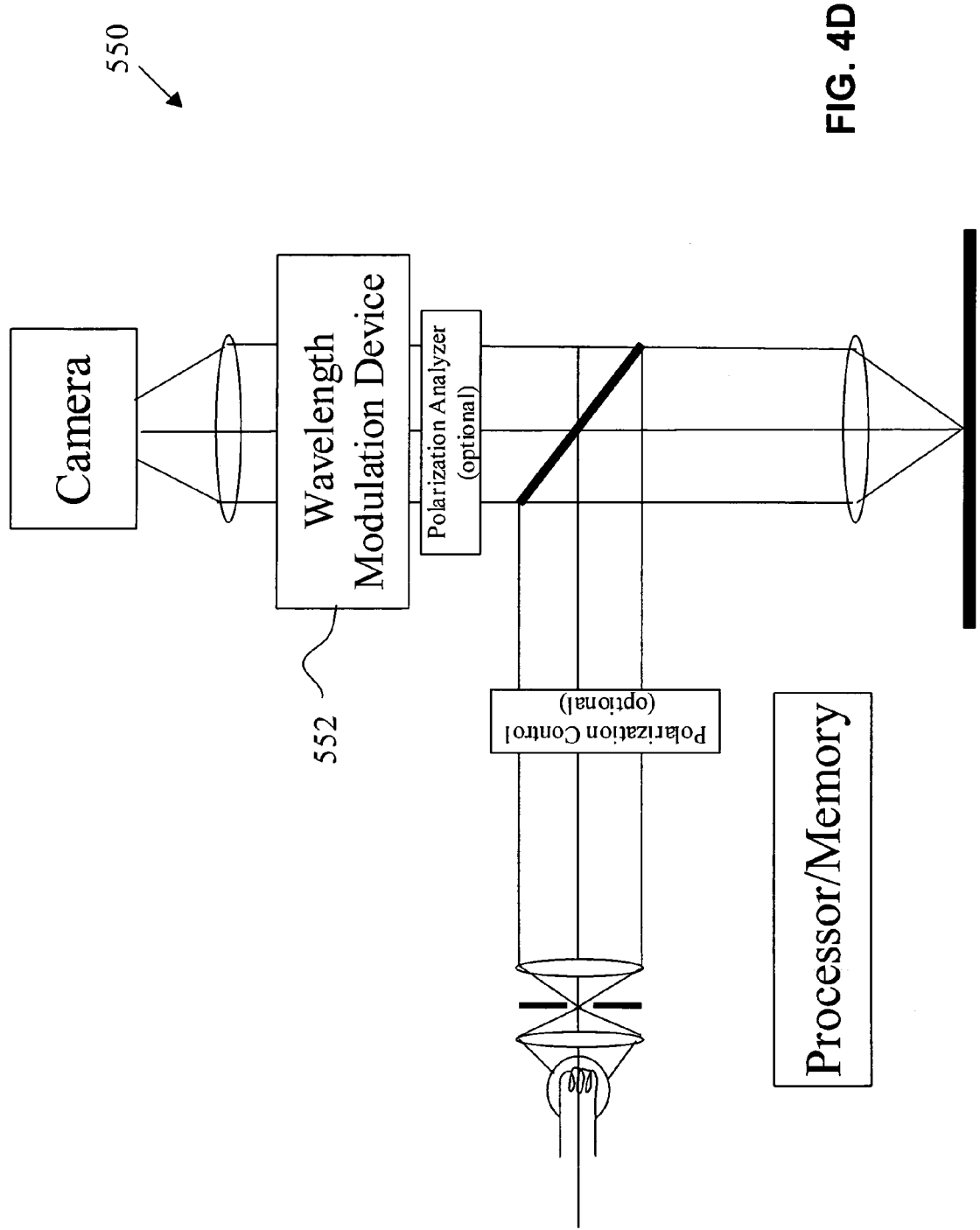
FIG. 4D shows a diagrammatic representation of a microscopic imaging system having a numerical aperture (NA) optimized for scattering characteristics in accordance with a fourth embodiment of the present invention.

The system 530 of FIG. 4B is similar to the system 500 of FIG. 4A, except a wavelength modulation device 532 is used in place of a wavelength selection device. The system 540 of FIG. 4C is similar to the system 500 of FIG. 4A, except the wavelength selection device 542 is positioned in the output beam path. The system 550 of FIG. 4D is similar to the system 500 of FIG. 4C, except a wavelength modulation device 532 is used in place of a wavelength selection device. The wavelength modulation device 532 can be controlled by changing one or more optical path lengths in the wavelength modulation device 532 itself (e.g., an interferometric system, such as in a Michelson, Fabry-Perot, or Sagnac interferometers). The spectral information can be derived from the resulting signal with a transform analysis like a Fourier transform or Hadamard transform, for example.

Multi-Angle, Simultaneous Scatterometry

Techniques of obtaining scatterometric measurements can include the 2-theta approach, in which scattering intensity from a grating or other repeating structure is measured at several angles by making multiple, sequential measurements. Another technique of making scatterometric measurements is spectroscopic scatterometry. Use of the 2-theta approach is very slow, since multiple measurements are typically made. Use of spectroscopic scatterometry requires sophisticated expensive optics. In a specific embodiment of the present invention, techniques and apparatus for simultaneous, multi-angle scatterometry are provided. Unlike the 2-theta approach, measurements are made with an apparatus that permits scattering intensity to be simultaneously determined for many angles. This technique is far faster than the 2-theta approach.

Figure 5:
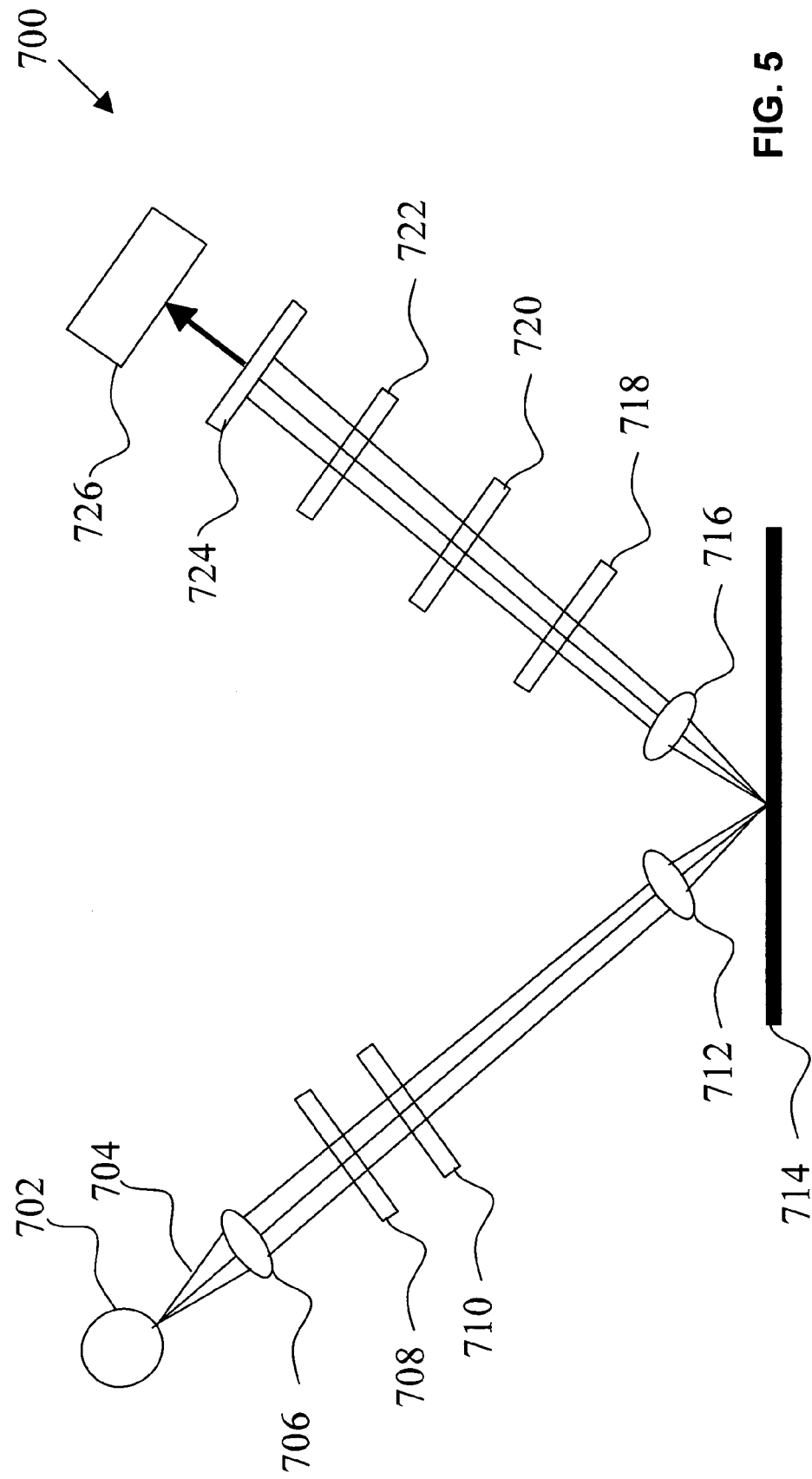
FIG. 5 shows a diagrammatic representation of a simultaneous, multiple angle of incidence ellipsometer.

In order to implement this approach, an optical apparatus such as that shown in U.S. Pat. No. 5,166,752 by Spanier et al can be used. This patent is herein incorporated by reference in its entirety. In this patent, a multi-angle ellipsometer is shown in, for example, FIGS. 3 and 4 of the Spanier et al. patent. FIG. 5 is a diagrammatic representation of a simultaneous, multiple angle of incidence ellipsometer 700. As shown, the ellipsometer includes a source generator (e.g., components 702, 706, 708, 710, and 712) for directing polarized light onto the surface of sample target 714, detection optics (e.g., components 718 through 724) for handling and detecting the output beam emitted from the sample target, and an analyzer 726 for analyzing the polarization state of the light reflected from the sample target. The source generator includes a light source 702, a polarizer 708, a compensator 710 with a variable aperture, and a focusing lens system 712 simultaneously directing polarized light from a single beam of light from the light source onto the sample target's surface at different angles of incidence. The source generator can also include an optional optical narrow band filter.

The lens system 712 has an effective aperture to focal length ratio for focusing the light on the sample target 714 with angles of incidence which vary over a range of angles of at least one or two degrees. In a particular embodiment, the range of angles of incidence is 30 degrees. Larger angles can be employed for directing rays at the sample target 714. The focusing lens system 712 focuses the polarized light which can be from a He—Ne laser for example, down to a single small spot or point on the sample target 714. The different incident rays can have widely varying angles of incidence that are focused on a single, small spot on the sample target 714. Thus, the light directed on the small spot on sample target 714 contains rays at many angles of incidence above and below the angle of incidence of the central ray through the focusing lens. Each one of the incoming rays is reflected at an angle equal to its angle of incidence with the polarization state of each of the rays being altered by that reflection. A detector array 722 is employed to detect several rays reflected from the sample target 714 individually over different, narrow ranges of angles of incidence to simply and quickly obtain data at several angles of incidence.

The output beam emitted from the sample target 714 is directed through output lens 716, interchangeable aperture 718, polarization analyzer 720, and an optional alternate filter 722 onto detector array 722. The diameter d of the lenses 712 and 716 corresponds to their effective diameter. In the illustrated embodiment the lenses 712 and 716 each have a diameter d of 18 mm and a focal length 1 of 34 mm. Other effective lens diameters and focal lengths can be employed so long as a range of angles of incidence, preferably at least 30 degrees, is provided. The lens diameter and focal length are chosen with a view toward maximizing the number of angles of incidence of the light beams that strike the sample target 714. In an alternative embodiment, light is transmitted through the sample target rather than reflected from a surface of the sample target. The refocusing lens or lenses 712 directs the reflected (transmitted) light toward the detector array 722. However, a refocusing lens need not be employed as the reflected (transmitted) light can be made to directly impinge upon an array of detectors. It is preferable that the lenses 712 and 716 do not themselves alter the polarization state of the light.

The detector array 722 can be a linear, multiple element detector wherein each of the detector elements can detect a narrow range of angles of incidence of the rays that illuminate the sample target. In the disclosed embodiment, the array 722 is a solid-state photosensitive detector array wherein the separate detector elements are all integrated on one circuit chip. Particularly, the detector elements include a linear array of photodiodes. While integrated on a single circuit chip, the individual photodiodes can function as separate detectors. The linear array of the disclosed embodiment includes 128 detector elements arranged in a row to provide data for 128 different angles of incidence where the full array is illuminated by the reflected (transmitted) light. The number of individual detector elements can be more or less than that in the disclosed embodiment and the detector elements need not be integrated on a single chip but can be discrete detectors. By using several detector elements, it is possible to simultaneously detect the light reflected from the surface (or transmitted through the sample target) for each of several different angles of incidence. It is also possible with the invention to employ a smaller number of detector elements which can be sequentially moved to mechanically scan the reflected (transmitted) rays for detection but this technique would require more time and can be less accurate, depending upon positioning accuracy.

The physical size of each of the detector elements is preferably less than the expanse of the reflected rays so that each element detects only a certain narrow range of angles of incidence on the illuminating side. The output of each of the detectors is used in a conventional manner as with real time computer techniques (e.g., through analyzer 724) to generate data in terms of $\Delta$ and $\Psi$ for each of those narrow ranges of angles of incidence. The data is then interpreted in a conventional manner. It matters in general which direction the linear array runs; the linear array preferably runs in the plane of the optical system. In the disclosed embodiment, the long axis of the linear detector array 722 lies in the plane of incidence of the central ray and perpendicular to the central ray for detecting the maximum number of incidence angles.

Such an ellipsometer can be used to illuminate a scatterometry sample target simultaneously over a range of angles, and an intensity of the scattered light is measured over a range of angles simultaneously with an array detector or the like. By collecting data from the intensities measured at those angles, the parameters of the grating or other target can be determined. For example, the data can be compared against theoretical models of data derived from techniques such as those mentioned by U.S. Pat. No. 6,590,656, issued Jul. 8, 2003, entitled "SPECTROSCOPIC SCATTEROMETER SYSTEM" by Xu et al, which patent is herein incorporated by reference in its entirety. The data can be compared to theoretical models derived from techniques such as those mentioned by U.S. patent application, having application Ser. No. 09/833,084, filed 10 Apr. 2001, entitled "PERIODIC PATTERNS AND TECHNIQUE TO CONTROL MISALIGNMENT", by Abdulhalim, et al., which application is herein incorporated by reference in its entirety. The data can be pre-generated and stored in libraries, or generated in real time during analysis. It is also possible, for techniques like scatterometric measurements, to directly compare measured spectra associated with various sample targets. It would also be possible to perform this technique with a beam profile reflectometer such as that described in U.S. Pat. No. 4,999,014, issued 12 Mar. 1991, entitled "METHOD AND APPARATUS FOR MEASURING THICKNESS OF THIN FILMS" by Gold et al., which patent is incorporated herein by reference in its entirety.

Simultaneous Ellipsometry and Reflectometry

A system for employing a combination of ellipsometers and reflectometers can be employed to improve the accuracy of scatterometric measurements of the printed sample target. In one embodiment, two or more ellipsometers are used as scatterometers. One of more of these ellipsometers can be spectroscopic ellipsometers. In another embodiment, two or more reflectometers are used as scatterometers. One of more of these reflectometers can be polarized reflectometers. Alternatively, a combination of one or more ellipsometers and one or more reflectometers are used as scatterometers. Measurements can be performed serially (with each tool performing measurements at different times), in parallel (with all tools performing measurements substantially-simultaneously, or in any other arrangement (e.g., at least two but less than all of the tools performing measurements substantially-simultaneously).

In any of the implementations described herein, various tools can perform measurements at different angles of incidence, including normally and obliquely. In a specific implementation, at least two tools perform scatterometric measurements at substantially the same angle of incidence but from different directions. For instance, a first tool would be used for scatterometric measurements in the x direction, and a second tool would be used for scatterometric measurements in the y direction. Such a system can eliminate certain common scattered signals, with a corresponding increase in accuracy of measurements, and provide a symmetric configuration.

An advantage of employing a combination of such tools in scatterometric determination is that the accuracy of the measurements can be increased. Another advantage in using more than one tool and performing measurements at more than one angle (or point) of incidence is to help separate effects affecting the medium of interest. A further advantage is that combinations of ellipsometers and reflectometers already exist in current inspection tools. Another advantage of employing a combination of scatterometers configured to perform scatterometry measurements substantially in parallel on different sample targets or different sample target sections can be to reduce the total time required for measurement. Another advantage of a parallel measurement system can be to increase the signal acquisition time for each scatterometry sample target and improve the measurement precision.

Scatterometric Determination Using FT Processing

A system for scatterometric measurement using Fourier transform (FT) processing can also be used. In one embodiment, an interferometer is employed to modulate substantially all wavelengths of a broadband source, and the scattered radiation is detected with a CCD camera. Substantially all wavelengths of the modulation band are recorded for each pixel, or for groups of pixels. As the interferometer steps through the modulation band, a spectroscopic image of the scattered signal is produced.

The resulting spectroscopic image can have a relatively large field of view. For example, the image can include several multiple sample targets. The spectroscopic image can be processed on a pixel-by-pixel basis. Alternatively, processing can be performed using groups of pixels to improve speed and decrease processing resources. In a specific implementation, a Michelson interferometer is used to step through a wavelength modulation band. Alternatively, a Linnik interferometer, or any other interferometer, can be employed. For each position of the mirror, a CCD camera records the scattered signal intercepted in the field of view of the camera. The detected signals can then be digitized and stored on a pixel-by-pixel basis, or as groups of pixels. The magnitude of the steps is generally proportional with the accuracy of the measurement. The speed of the camera (e.g., the number of fields per second that the camera can capture) is typically proportional with the speed of the measurement. Once the modulation band is spanned, the signal recorded for each pixel (or group of pixels) can be used as a basis for a discrete Fourier transformation (or DFT). The DFT provides a spectral profile for each pixel (or group of pixels).

Multiple Tunable Lasers

A system, which has a combination of tunable lasers, can be used to improve the accuracy of scatterometric measurements in combination with measurements performed by various configurations of ellipsometers and reflectometers. The tunable lasers provide radiation incident on the surface of interest. In one embodiment, scatterometric measurements are performed using sample targets disposed in at least one layer of the design under consideration, and the tunable lasers provide radiation beams incident on the sample targets. The measured signals can then be averaged together before or after processing.

Scatterometric Determination Using Spatial Filtering

One embodiment expands on the above described embodiment for Scatterometric Determination using FT Processing. A system for scatterometric measurement using FT processing in connection with spatial filtering is provided. More particularly, the signal reflected by the sample targets is selectively filtered spatially to only process particular signal components.

In the above described embodiment for Scatterometric Determination using FT Processing, an interferometer is employed to modulate substantially all wavelengths of a broadband source, and the scattered radiation is detected with a detector, such as a CCD camera. Substantially all wavelengths can then be recorded for each pixel, or for groups of pixels. As the interferometer steps through the modulation band, a spectroscopic image of the scattered signal is produced. In the present example, where the scattered signal corresponding to a complete image (or a portion of an image) is collected, only a portion of the signal corresponding to a single line of pixels is retained. Alternatively, a portion of the signal corresponding to several pixel lines, but less than the whole image, is collected. Such a selective collection of the scattered signal can be achieved by spatially filtering the signal to only retain horizontal, vertical or oblique stripes of the signal corresponding to rows of pixels in the detector or CCD camera. Alternatively, a larger, more complete portion of the scattered signal can be collected at the CCD camera, but the information corresponding to undesirable rows of pixels (e.g., an edge of a sample target or a border between two sample targets) can be discarded subsequent to the collection. The spectroscopic image corresponding to the retained signal can then be processed on a pixel-by-pixel basis. Alternatively, processing can be performed using groups of pixels to improve speed and decrease processing resources. This embodiment provides higher SNR over conventional processing methods.

In one implementation of the invention, the above described techniques in reference to the Scatterometric Determination using FT Processing embodiment can be used. Compared to the embodiment for Scatterometric Determination using FT Processing, aspects of the embodiment for Scatterometric Determination Using Spatial Filtering can improve the processing speed and the throughput, while decreasing processing resources.

Examples of Spectroscopic Ellipsometers and Spectroscopic Reflectometers

Figure 6:
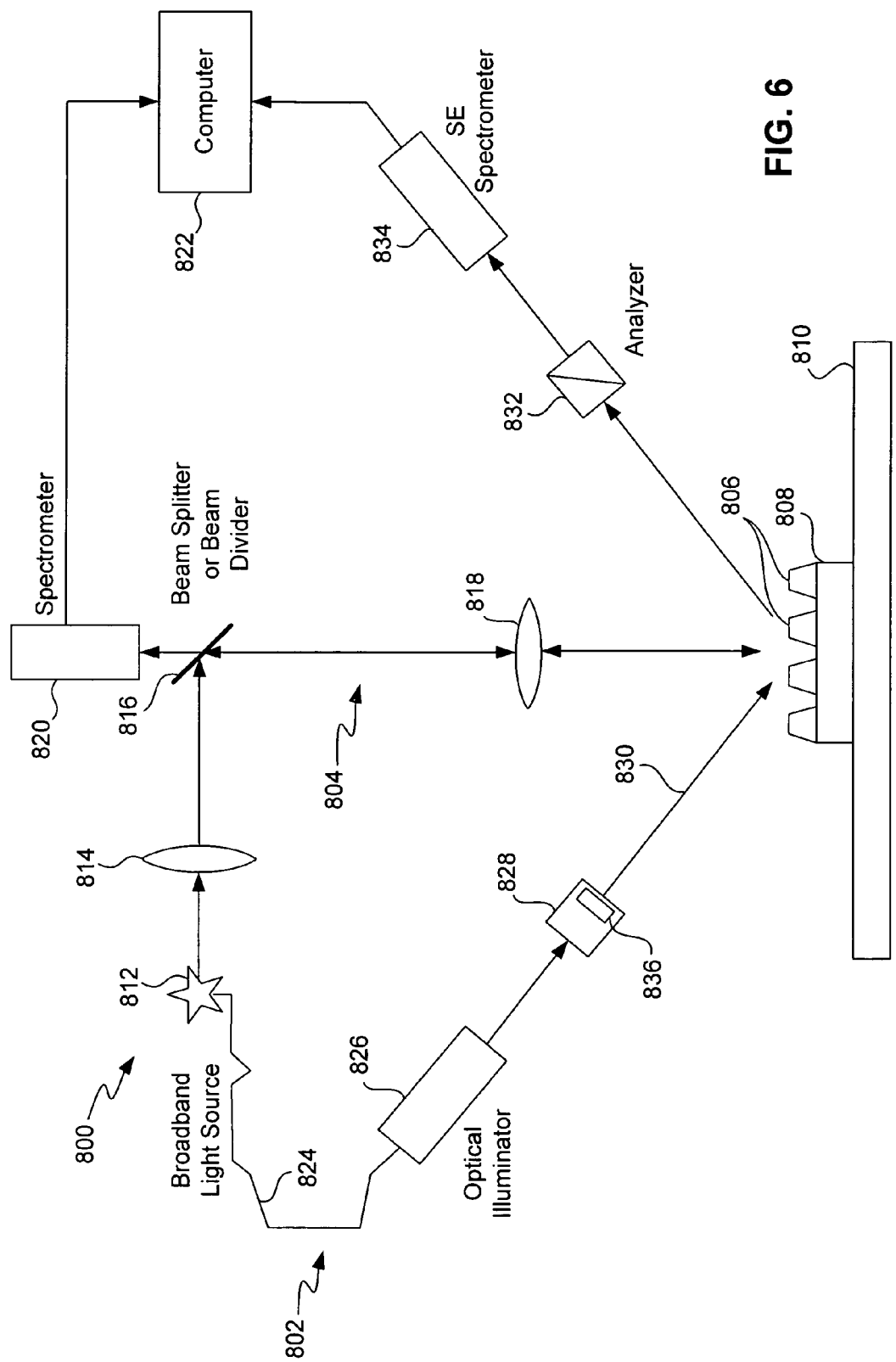
FIG. 6 shows a schematic view of a spectroscopic scatterometer system in accordance with one embodiment of the present invention.

FIG. 6 is a schematic view of a spectroscopic scatterometer system 800, in accordance with one embodiment of the present invention. The system 800 combines the features of a spectroscopic ellipsometer 802 and spectroscopic reflectometer 804, each of which can be used for measuring a grating structure 806 disposed on a substrate or wafer 808. The grating structure 806, which is shown in a somewhat simplified format in FIG. 6, can be widely varied. The grating structure 806 can, for example, correspond to any of those grating structures described herein. Both the spectroscopic ellipsometer 802 and spectroscopic reflectometer 804 can use a stage 810, which is used for moving the substrate 808 in the horizontal xy directions as well as the vertical z direction. The stage can also rotate or tilt the substrate. In operation, the stage 810 moves the substrate 808 so that the grating structure 806 can be measured by the spectroscopic ellipsometer 802 and/or the spectroscopic reflectometer 804.

The spectroscopic ellipsometer 802 and spectroscopic reflectometer 804 also use one or more broadband radiation sources 812. By way of example, the light source 812 can supply electromagnetic radiation having wavelengths in the range of at least 230 to 800 nm. Examples of broadband light sources include deuterium discharge lamps, xenon arc lamps, tungsten filament lamps, and quartz halogen lamps. Alternatively, one or more laser radiation sources can be used instead of or in combination with the broadband light source.

In the spectroscopic reflectometer 804, a lens 814 collects and directs radiation from source 812 to a beam splitter 816, which reflects part of the incoming beam towards the focus lens 818, which focuses the radiation onto the substrate 808 in the vicinity of the grating structure 806. The light reflected by the substrate 808 is collected by the lens 818, passes through the beam splitter 816 to a spectrometer 820. The spectral components are detected and signals representing such components are supplied to the computer 822.

In the spectroscopic ellipsometer 802, the light source 812 supplies light through a fiber optic cable 824, which randomizes the polarization and creates a uniform light source for illuminating the substrate 808. Upon emerging from the fiber 824, the radiation passes through an optical illuminator 826 that can include a slit aperture and a focus lens (not shown). The light emerging from the illuminator 826 is polarized by a polarizer 828 to produce a polarized sampling beam 830 illuminating the substrate 808. The radiation emerging from the sampling beam 830 reflects off of the substrate 808 and passes through an analyzer 832 to a spectrometer 834. The spectral components of the reflected radiation are detected and signals representing such components are supplied to the computer 822.

In the spectroscopic ellipsometer 802, either the polarizer 828 or the analyzer 832 or both can include a waveplate, also known as compensator or retarder (not shown). The waveplate changes the relative phase between two polarizations so as to change linearly polarized light to elliptically polarized light or vice versa. In order to collect more information about the interaction of the incident polarized light 830 with the sample target, it is desirable to modulate the polarization state of the light or modulate the polarization sensitivity of the analyzer or both. Typically this is done by rotating an optical element within the polarizer and/or analyzer. A polarizing element within the polarizer or analyzer can be rotated, or, if at least one of those assemblies contains a waveplate, the waveplate can be rotated. The rotation can be controlled by the computer 822 in a manner known to those skilled in the art. Although the use of a rotating element can work well, it can limit the system 802. As should be appreciated, the use of rotating elements can be slow, and because there are moving parts they tend to be less reliable.

In accordance with one embodiment, therefore, the polarizer 828 is configured to include a polarization modulator 836, such as photoelastic modulator (PEM), in order to produce a fast and reliable spectroscopic ellipsometer. The polarization modulator replaces the rotating waveplate. The polarization modulator 836 is an optical element that performs the same function as a rotating waveplate, but without the costly speed and reliability problems. The polarization modulator 836 allows electrical modulation of the phase of the light without mechanically rotating any optical components. Modulation frequencies as high as 100 kHz are readily attainable. In an alternative embodiment, the analyzer 832 is configured to include a polarization modulator such as a PEM (Photoelastic Modulator) that can be modulated electrically. In yet another embodiment, both the polarizer and analyzer contain polarization modulators, such as PEMs, that are modulated at different frequencies.

Because the polarization modulator 836 can modulate at such a high frequency, the polarization modulator 836 can be used to perform various techniques, which would otherwise be too slow. For example, the difference between the polarized reflectivity of two structures can be obtained. To do this, a PEM can be combined with an acoustic optical modulator (AOM), where the AOM rapidly moves between the two structures while modulating the polarization state at a different (but related, such as multiple or submultiple) frequency. Signals at the sum and the difference of the PEM and AOM modulation frequencies contain useful information and can be detected with high signal-to-noise by synchronous detection. Alternatively the AOM on the incident beam can be used in combination with a PEM in the analyzer. Although not shown, the rotating waveplate can also be replaced by a polarization modulator in other types of scatterometric systems as for example a polarization sensitive reflectometer.

Scatterometric Database

One aspect of the present invention provides a database of scatterometric information that can be used for scatterometric determination. In one implementation, one or more databases are provided which include one or more libraries of information. The database information is then used in measurements.

In one implementation, the libraries are compiled using simulated predetermined test patterns representing various quasi-periodic structures for different features, as discussed above. Alternatively, this information is obtained from actually measured sample targets. The database can also include information regarding materials, process conditions, optical parameters, and other relevant data. The database information can be further enhanced by interpolation and other preprocessing.

The scatterometry database information can be used to improve the accuracy and speed of measurements by retrieving scatterometry data associated with particular scatterometric measurements and process conditions recorded during actual measurements. Dynamic selection of a measurement algorithm or methods can also be provided based on database lookups. A further implementation uses the database to calibrate scatterometric measurement tools before or during production line measurements.

Alternative Systems for Performing Scatterometry

According to an embodiment of the invention, acquisition of the spectra is performed using an optical apparatus that can include any of the following or any combination of the following apparatus: an imaging reflectometer, an imaging spectroscopic reflectometer, a polarized spectroscopic imaging reflectometer, a scanning reflectometer system, a system with two or more reflectometers capable of parallel data acquisition, a system with two or more spectroscopic reflectometers capable of parallel data acquisition, a system with two or more polarized spectroscopic reflectometers capable of parallel data acquisition, a system with two or more polarized spectroscopic reflectometers capable of serial data acquisition without moving the wafer stage or moving any optical elements or the reflectometer stage, imaging spectrometers, imaging system with wavelength filter, imaging system with long-pass wavelength filter, imaging system with short-pass wavelength filter, imaging system without wavelength filter, interferometric imaging system (e.g. Linnik microscope, e.g. Linnik microscope as implemented in the KLA-Tencor measurements tools models 5100, 5200, 5300, Archer10, and so on available from KLA-Tencor of San Jose, Calif.), imaging ellipsometer, imaging spectroscopic ellipsometer, a scanning ellipsometer system, a system with two or more ellipsometers capable of parallel data acquisition, a system with two or more ellipsometers capable of serial data acquisition without moving the wafer stage or moving any optical elements or the ellipsometer stage, a Michelson interferometer, a Mach-Zehnder interferometer, or a Sagnac interferometer.

Several embodiments of an interferometer based imaging spectrometer, as well as other types of imaging spectrometers such as filter based or the "push broom" approach, are described in U.S. Pat. No. 5,835,214, issued 10 Nov. 1998, entitled "METHOD AND APPARATUS FOR SPECTRAL ANALYSIS OF IMAGES", by Cabib et al. System and Method embodiments for film thickness mapping with spectral imaging are described in U.S. Pat. No. 5,856,871, issued 5 Jan. 1999, entitled "FILM THICKNESS MAPPING USING INTERFEROMETRIC SPECTRAL IMAGING", by Cabib et al. An alternative architecture for spectral imaging based on LED illumination is described in U.S. Pat. No. 6,142,629, issued 7 Nov. 2000, entitled "SPECTRAL IMAGING USING ILLUMINATION OF PRESELECTED SPECTRAL CONTENT", by Adel et al. These patents are incorporated herein by reference in their entirety for all purposes.

The imaging spectrometer or reflectometer used for acquisition of the spectra according to an embodiment of the invention can be of the Fourier transform imaging spectrometer type as is well understood by those skilled in the art. The imaging system of the Fourier transform imaging spectrometer should be capable of separating (resolving) the reflected or scattered light signals from the different sample targets. Alternatively the imaging spectrometer or reflectometer used for acquisition of scatterometry signals can use a two-dimension detector where one axis contains the spatial information from the different scatterometry sample targets and the other detector axis contains spectrally resolved information from light spectroscopically separated with a prism system or diffraction grating system, for example or a system that is a combination of a prism and a grating. The illumination radiation can be wavelength selected prior to incidence on the sample target. The spectra obtained from the sample targets detected in the imaging spectrometers, imaging reflectometers, or any of the other optical systems identified above in connection with various embodiments of the present invention can be unpolarized or selectively polarized. One or more of the unpolarized light or one or more of the polarization components of the reflected or scattered light from the sample targets can be detected with the imaging spectrometer or the imaging reflectometer.

In various implementations, separate detection systems can be used to separately or simultaneously record one or more of the following light signals: unpolarized reflected light, polarized light with the electric field substantially parallel to one major symmetry axis of one layer of the scatterometry sample targets, polarized light with the electric field substantially perpendicular to one major symmetry axis of one layer of the scatterometry sample targets, polarized light with the electric field at an angle to one major symmetry axis of one layer of the scatterometry sample targets, right-hand circularly polarized radiation, left-hand circularly polarized radiation, and/or a combination of two or more of the previously listed polarization states. A separate detector system can be used to simultaneously record the signal from part of the light source for the purposes of light noise monitoring, and/or light level control, and/or light noise subtraction or normalization.

The invention can be implemented in digital electronic circuitry, or in computer hardware, firmware, software, or in combinations of them. Apparatus of the invention can be implemented in a computer program product tangibly embodied in a machine-readable storage device for execution by a programmable processor; and method steps of the invention can be performed by a programmable processor executing a program of instructions to perform functions of the invention by operating on input data and generating output. The invention can be implemented advantageously in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors. Generally, a processor will receive instructions and data from a read-only memory and/or a random access memory. Generally, a computer will include one or more mass storage devices for storing data files; such devices include magnetic disks, such as internal hard disks and removable disks; magneto-optical disks; and optical disks. Storage devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs (application-specific integrated circuits).

To provide for interaction with a user, the invention can be implemented on a computer system having a display device such as a monitor or LCD screen for displaying information to the user. The user can provide input to the computer system through various input devices such as a keyboard and a pointing device, such as a mouse, a trackball, a microphone, a touch-sensitive display, a transducer card reader, a magnetic or paper tape reader, a tablet, a stylus, a voice or handwriting recognizer, or any other well-known input device such as, of course, other computers. The computer system can be programmed to provide a graphical user interface through which computer programs interact with users.

Finally, the processor optionally can be coupled to a computer or telecommunications network, for example, an Internet network, or an intranet network, using a network connection, through which the processor can receive information from the network, or might output information to the network in the course of performing the above-described method steps. Such information, which is often represented as a sequence of instructions to be executed using the processor, may be received from and outputted to the network, for example, in the form of a computer data signal embodied in a carrier wave. The above-described devices and materials will be familiar to those of skill in the computer hardware and software arts.

It should be noted that the present invention employs various computer-implemented operations involving data stored in computer systems. These operations include, but are not limited to, those requiring physical manipulation of physical quantities. Usually, though not necessarily, these quantities take the form of electrical or magnetic signals capable of being stored, transferred, combined, compared, and otherwise manipulated. The operations described herein that form part of the invention are useful machine operations. The manipulations performed are often referred to in terms, such as, producing, identifying, running, determining, comparing, executing, downloading, or detecting. It is sometimes convenient, principally for reasons of common usage, to refer to these electrical or magnetic signals as bits, values, elements, variables, characters, data, or the like. It should remembered however, that all of these and similar terms are to be associated with the appropriate physical quantities and are merely convenient labels applied to these quantities.

The present invention also relates to a device, system or apparatus for performing the aforementioned operations. The system may be specially constructed for the required purposes, or it may be a general-purpose computer selectively activated or configured by a computer program stored in the computer. The processes presented above are not inherently related to any particular computer or other computing apparatus. In particular, various general-purpose computers may be used with programs written in accordance with the teachings herein, or, alternatively, it may be more convenient to construct a more specialized computer system to perform the required operations.

A number of implementations of the invention have been described. Nevertheless, it will be understood that various modifications may be made without departing from the spirit and scope of the invention. For example, the invention has also been described with reference to optical measurements and OPC model tuning, but other types of measurements could also be used, such as CD-SEM. The invention can be used to tune lithographic printing devices rather than OPC models, that is, the invention operates during a different stage of manufacturing. The measured data can also be used to tune the lithographic printing process, for example, as a function of focus and dose to find the maximum process window. The data can also be used to tune etch processes or as a factor in predicting yield of the process. The techniques described above can also be used for e-beam direct write for optimizing the write process, in which case no reticle is used. In the various embodiments of the optical systems described above, all wavelengths and/or angles can be collected simultaneously or in sequence. Alternatively, a standard single-spot spectrometer can be used in combination with scanning the wafer, which results in the same information being collected but in a time domain rather than with a 2-dimensional CCD detector. The techniques above have been described with respect to quasi-periodic structures that show a variation along one dimension only, but as the skilled reader realizes, other embodiments of quasi-periodic structure can exhibit a variation along two dimensions. Accordingly, other embodiments are within the scope of the following claims.

The invention claimed is:

1. A method for optimizing feature printability on a semiconductor wafer, comprising:

providing a reticle having a quasi-periodic structure formed thereon, the quasi-periodic structure including a plurality of elements that each contribute to a printed feature to be printed on the wafer, wherein each element exhibits a slight variation in a reticle feature characteristic compared to an adjacent other element in the quasi-periodic structure;

using the reticle with the quasi-periodic structure to print a plurality of printed features on the semiconductor wafer, wherein each printed feature corresponds to a specific element in the quasi-periodic structure;

performing a metrology process on the semiconductor wafer to generate a signature for each of the printed features; and using the signature to determine an optimum reticle feature characteristic that results in an optimum printed feature.

2. The method of claim 1, wherein using the signature to determine an optimum reticle feature characteristic that results in an optimum printed feature comprises:

comparing one or more of the measured signatures with a known signature corresponding to an optimum printed structure; and either (i) identifying a best match between one or more of the measured signatures and the known signature and defining the reticle characteristic of the matched measured signature as the optimum reticle feature characteristic, or (ii) interpolating or extrapolating the optimum element characteristic based on the comparison between the one or more measured signatures and the known signature.

3. The method of claim 2, wherein the known signature is generated by simulating the metrology process on the optimum printed structure.

4. The method of claim 1, wherein the elements in the quasi-periodic structure exhibit a continuous variation from a first shape on a first end of the quasi-periodic structure to a second shape on a second end of the quasi-periodic structure.

5. The method of claim 1, wherein the quasi-periodic structure includes about 50-200 elements.

6. The method of claim 1, using the signature to determine an optimum reticle feature characteristic that results in an optimum printed feature comprising:

matching each of the measured signatures with one of a plurality of known signatures corresponding to printed features with known appearances;

providing the measured optical signatures to an optical proximity correction modeling system; and using the measured optical signatures in the optical proximity correction modeling system to optimize an optical proximity correction model used in printing the feature on the semiconductor wafer.

7. The method of claim 6, wherein the known signatures are generated by simulating the metrology process on a plurality of known printed features.

8. The method of claim 1, further comprising:

using the measured optical signatures to optimize one or more process parameters in a system that is used to print the feature on the semiconductor wafer, in order to achieve improved feature printability.

9. The method of claim 8, wherein the process parameters are selected from a group consisting of: focus parameters and dose parameters.

10. The method of claim 1, further comprising:

using the measured optical signatures to optimize one or more etch process parameters in a system that is used to etch the printed feature on the semiconductor wafer, in order to achieve improved feature printability.

11. The method of claim 1, further comprising:

using the measured optical signatures to optimize one or more yield prediction parameters in a system that is used to predict yield of a plurality of semiconductor wafers.

12. The method of claim 1, wherein performing metrology on the semiconductor wafer includes performing optics metrology using a scatterometry measurement technique.

13. The method of claim 12 wherein the scatterometry technique is selected from a group consisting of: spectroscopic scatterometry techniques and angular scatterometry techniques.

14. The method of claim 12, wherein the scatterometric signals are recorded with a two-dimensional detector having a first axis for registering spectral or angular scatterometry data, and a second axis for registering spatial data corresponding to the positions of the elements in the quasi-periodic structure.

15. The method of claim 1, wherein performing metrology on the semiconductor wafer comprises:

generating a metrology recipe based on the quasi-periodic structure on the reticle; and performing the metrology of the semiconductor wafer in accordance with the generated metrology recipe.

16. A reticle for use in optimizing feature printability in a semiconductor wafer printing process, the reticle including a quasi-periodic structure having a plurality of elements that each contribute to a feature to be printed, wherein each element exhibits a slight variation in appearance compared to the other elements in the quasi-periodic structure wherein the elements in the quasi-periodic structure exhibit a continuous variation from a first shape on a first end of the quasi-periodic structure to a second shape on a second end of the quasi-periodic structure.

17. The reticle of claim 16, wherein the quasi-periodic structure includes about 50-200 elements.

18. The reticle of claim 16, wherein each element has a slightly varying position of a Sub Resolution Assist Feature with respect to a line structure as compared to an adjacent element.

19. The reticle of claim 16, wherein each element has a slightly varying characteristic of an optical proximity correction feature with respect to an adjacent printable structure as compared to an adjacent element.

* * * * *